United States Patent
Qing (10) Patent No.: US 12,408,558 B2
(45) Date of Patent: Sep. 2, 2025

(54) METHOD FOR CONSTRUCTING MAGNETIC TUNNELING JUNCTION DEVICES AND USE OF DEVICE FOR SPIN-DEPENDENT TRANSPORT CHARACTERIZATION

(71) Applicant: Quan Qing, Chandler, AZ (US)

(72) Inventor: Quan Qing, Chandler, AZ (US)

(73) Assignee: ARIZONA BOARD OF REGENTS ON BEHALF OF ARIZONA STATE UNIVERSITY, Scottsdale, AZ (US)

( * ) Notice: Subject to any disclaimer, the term of this patent is extended or adjusted under 35 U.S.C. 154(b) by 337 days.

(21) Appl. No.: 18/004,660

(22) PCT Filed: Jul. 6, 2021

(86) PCT No.: PCT/US2021/040568
§ 371 (c)(1),
(2) Date: Jan. 6, 2023

(87) PCT Pub. No.: WO2022/010935
PCT Pub. Date: Jan. 13, 2022

(65) Prior Publication Data
US 2023/0247910 A1     Aug. 3, 2023

Related U.S. Application Data

(60) Provisional application No. 63/049,477, filed on Jul. 8, 2020.

(51) Int. Cl.
*H10N 50/01*     (2023.01)
*H10N 50/10*     (2023.01)
*H10N 50/20*     (2023.01)

(52) U.S. Cl.
CPC ............. *H10N 50/01* (2023.02); *H10N 50/10* (2023.02); *H10N 50/20* (2023.02)

(58) Field of Classification Search
CPC ......... H10N 50/01; H10N 50/20; H10N 50/10
See application file for complete search history.

(56) References Cited

U.S. PATENT DOCUMENTS 7,906,345 B2    3/2011    Wang et al.
8,318,093 B2    11/2012    Wang et al.
(Continued)

FOREIGN PATENT DOCUMENTS

EP     2 195 461 B1    6/2010
EP     3 391 037 A1    6/2017
(Continued)

OTHER PUBLICATIONS

Albrecht, T., "Single-Molecule Analysis with Solid-State Nanopores", Annual Reviews, Feb. 1, 2019, 19 pages.
(Continued)

*Primary Examiner* — Richard A Booth
(74) *Attorney, Agent, or Firm* — Womble Bond Dickinson (US) LLP (57) ABSTRACT

A magnetic tunneling junction (MTJ) device structure and the method of constructing such device are disclosed. Also disclosed are methods of using the device for spin-dependent transport characterization through biomolecules for structure and dynamic function analysis in physiological environments.

21 Claims, 3 Drawing Sheets

(56) References Cited

U.S. PATENT DOCUMENTS

| | | | |
|---|---|---|---|
| 9,810,680 | B2 | 11/2017 | Chou et al. |
| 9,903,820 | B2 | 2/2018 | Meller et al. |
| 9,921,181 | B2 | 3/2018 | Baldauf et al. |
| 10,065,154 | B2 | 9/2018 | Aguilar et al. |
| 2010/0267158 | A1 | 10/2010 | Chou et al. |
| 2011/0063758 | A1 | 3/2011 | Wang et al. |
| 2012/0193236 | A1 | 8/2012 | Peng et al. |
| 2013/0119497 | A1 | 5/2013 | Li |
| 2014/0190833 | A1 | 7/2014 | Lieber et al. |
| 2015/0010935 | A1 | 1/2015 | Lindsey et al. |
| 2016/0025702 | A1 | 1/2016 | Lindsay et al. |
| 2017/0199149 | A1 | 7/2017 | Gundlach et al. |
| 2018/0298436 | A1 | 10/2018 | Lei et al. |
| 2021/0151501 | A1* | 5/2021 | Prasad ................. G11C 11/1675 |
| 2023/0240080 | A1* | 7/2023 | Bauer .................. H10N 30/704 |

FOREIGN PATENT DOCUMENTS

| | | |
|---|---|---|
| EP | 3 391 037 B1 | 6/2022 |
| KR | 10-2011-102652 A | 9/2011 |
| WO | WO 2022/010935 A2 | 1/2022 |
| WO | WO 2022/055604 A2 | 3/2022 |

OTHER PUBLICATIONS

Bayley, H., "Nanopore Sequencing: From Imagination to Reality", Clinical Chemistry, 2015, vol. 61, No. 1., pp. 25-31.

Branton, D., et al., "The potential and challenges of nanopore sequencing", Nature Biotechnology, Oct. 9, 2008, vol. 26., No. 10., pp. 1146-1153.

Chen, K., "Direction- and Salt-Dependent Ionic Current Signatures for DNA Sensing with Asymmetric Nanopores", Biophysical Journal, Feb. 28, 2017, vol. 112., pp. 674-682.

Di Fiori, N., et al., "Optoelectronic control of surface charge and translocation dynamics in solid-state nanopores", Nature Nanotechnology, Nov. 3, 2013, vol. 8., p. 946-951.

Di Ventra, M., et al. "Decoding DNA, RNA and peptides with quantum tunnelling", Nature Nanotechnology, Feb. 3, 2016, vol. 11., pp. 117-126.

Fischbein, M., et al., "Electron Beam Nanosculpting of Suspended Graphene Sheets", Department of Physics and Astronomy, University of Pennsylvania, Sep. 16, 2008, pp. 1-11.

Fologea, D., et al., "Slowing DNA Translocation in a Solid-State Nanopore", Nano Letters, Jun. 7, 2005, vol. 5, No. 9, pp. 1734-1737.

Fuller, C., et al., "Real-time single-molecule electronic DNA sequencing by synthesis using polymer-tagged nucleotides on a nanopore array", PNAS, May 10, 2016, vol. 113, No. 9, pp. 5233-5238.

Garaj, S., et al., "Graphene as a subnanometre trans-electrode membrane", Nature, Sep. 9, 2010, vol. 467, pp. 190-195.

Hall, J. "Letter to the Editor", The Journal of General Physiology, Jun. 6, 1975, vol. 66, pp. 531-532.

Healy, K., et al., "Fabrication and characterization of nanopores with insulated transverse nanoelectrodes for DNA sensing in salt solution", Electrophoresis, Aug. 9, 2012, vol. 33, pp. 3488-3496.

Heerema, S., et al., "Graphene nanodevices for DNA sequencing", Nature Nanotechnology, Feb. 3, 2016, vol. 11, pp. 127-136.

Huang, S., et al., "Identifying single bases in a DNA oligomer with electron tunnelling", Nature Nanotechnology, Dec. 2010, vol. 5., pp. 868-873.

International Search Report and Written Opinion of the International Searching Authority, mailed Feb. 14, 2022, corresponding to PCT/US21/40568, 6 pages.

International Search Report and Written Opinion of the International Searching Authority, mailed Apr. 5, 2022, corresponding to PCT/US21/40562, 10 pages.

Ip, C., et al., "MinION Analysis and Reference Consortium: Phase 1 data release and analysis [version 1; referees: 2 approved]", F1OOO Research, Oct. 15, 2015, pp. 1-35.

Ivanov, A., et al., "DNA Tunneling Detector Embedded in a Nanopore", Nano Letters, 2011, vol. 11, pp. 279-285.

Ivanov, A., et al., "High Precision Fabrication and Positioning of Nanoelectrodes in a Nanopore", ACS Nano, 2014, vol. 8, No. 2, pp. 1940-1948.

Jain, M., et al., "Improved data analysis for the MinION nanopore sequencer", Nature Methods, Apr. 2015, vol. 12, No. 4, pp. 351-358.

Jain, M., et al., "MinION Analysis and Reference Consortium: Phase 2 data release and analysis of R9.0 chemistry [version 1; referees: 1 approved, 2 approved with reservations]", F1OOO Research, Jul. 28, 2017, pp. 1-18.

Janda, J., et al., "Evolving Concepts Regarding the Genus Aeromonas: An Expanding Panorama of Species, Disease Presentations, and Unanswered Questions", Aeromonas Infections, Aug. 27, 1998, pp. 332-344.

Kasianowicz, J., et al., "Characterization of individual polynucleotide molecules using a membrane channel", Biophysics, Nov. 1996, vol. 93, pp. 13770-13773.

Krishnakumar, P. et al. "Slowing DNA Translocation through a Nanopore Using a 38 Functionalized Electrode", ACS Nano, 2013, 16 pages.

Larkin, J., et al., "Slow DNA Transport through Nanopores in Hafnium Oxide Membranes", ACS Nano, 2013, vol. 7, No. 11, pp. 10121-10128.

Laszlo, A., et al., "Decoding long nanopore sequencing reads of natural DNA", Nature Biotechnology, Aug. 2014, vol. 32., No. 8, pp. 829-834.

Li, J., et al., "Ion-beam sculpting at nanometre length scales", Nature, Jul. 12, 2001, vol. 412, pp. 166-169.

Liang, X., et al., "Nanogap Detector Inside Nanofluidic Channel for Fast Real-Time Label-Free DNA Analysis", Nano Letters, 2008, vol. 8, No. 5, pp. 1472-1476.

Lindsay, S., "The promises and challenges of solid-state sequencing", Nature Nanotechnology, Feb. 2016, vol. 11, pp. 109-111.

Luan, B., et al., "Dynamics of DNA translocation in a solid-state nanorpore immersed in aqueous glycerol", Nanotechnology, 2012, vol. 23, 7 pages.

Meller, A., et al., "Rapid nanopore discrimination between single polynucleotide molecules", PNAS, Feb. 1, 2000, vol. 97, No. 3, pp. 1079-1084.

Mikheyev, A., et al., "A first look at the Oxford Nanopore MinION sequencer", Molecular Ecology, 2014, vol. 14, pp. 1097-1102.

Mueller, M., et al., "The structure of a cytolytic α-helical toxin pore reveals its assembly mechanism", Nature, Jun. 4, 2009, vol. 459, pp. 726-731.

Naaman, R., et al., "Chiral molecules and the electron spin", Nat. Rev. Chem. 3, 250-260, Mar. 25, 2019, https://doi.org/10.1038/s41570-019-0087-1, 27 pages.

Naaman, R., et al., "Spintronics and Chirality: Spin Selectivity in Electron Transport Through Chiral Molecules", The Annual Review of Physical Chemistry, Jan. 19, 2015, pp. 263-284.

Nam, S.-W., et al., "Ionic Field Effect Transistors with Sub-10 nm Multiple Nanopores", Nano Letters, 2009, vol. 9, No. 5, pp. 2044-2048.

Niederweis, M., "Mycobacterial porins—new channel proteins in unique outer membranes", Molecular Microbiology, 2003, vol. 49, No. 5, pp. 1167-1177.

Qing, Q. et al. "Finely Tuning Metallic Nanogap Size with Electrodeposition by Utilizing High-Frequency Impedance in Feedback", Nanotechnology, 2005, 5 pages.

Quick, J., et al., "Real-time, portable genome sequencing for Ebola surveillance", Nature, Feb. 11, 2016, vol. 530, pp. 228-245.

Sadar, J. "Top-down and bottom-up strategies to prepare nanogap sensors for controlling and characterizing single biomolecules", a dissertation, Arizona State University, https://www.proquest.com/docview/2288107671, 2019, 24 pages.

Sadar, J. et al. "Confined Electrochemical Deposition in Sub-15 nm Space for Preparing 31-32 Nanogap Electrodes", ECS Transactions, 2017, 9 pages.

Shi, W., et al., "Nanopore Sensing", Analytical Chemistry, 2017, vol. 89, pp. 157-188.

Song, L., et al., "Structure of Staphylococcal α-Hemolysin, a Heptameric Transmembrane Pore", Science, Dec. 13, 1996, vol. 274, pp. 1859-1867.

(56) References Cited

OTHER PUBLICATIONS

Storm, A.J., et al., "Fabrication of solid-state nanopores with single-nanometre precision", Nature Materials, Aug. 2003, vol. 2, pp. 537-541.

Subbarao, G., et al., "Crystal Structure of the Monomeric Porin OmpG", JMB, 2006, vol. 360, pp. 750-759.

Taniguchi, M., et al., "Fabrication of the gating nanopore device", Applied Physics Letters, 2009, vol. 95, 4 pages.

Tsutsui, M., et al., "Identifying single nucleotides by tunnelling current", Nature Nanotechnology, Apr. 2010, vol. 5, pp. 286-290.

Tsutsui, M., et al., "Single-molecule sensing electrode embedded in-plane nanopore", Scientific Reports, Jul. 28, 2011, vol. 1. No. 46, 6 pages.

Tsutsui, M., et al., "Transverse electric field dragging of DNA in a nanochannel", Scientific Reports, May 3, 2012, vol. 2, No. 394, 7 pages.

Venkatesan, B.M., et al., "Highly Sensitive, Mechanically Stable Nanopore Sensors for DNA Analysis", Advanced Materials, 2009, vol. 21, pp. 2771-2776.

Venkatesan, B.M., et al., "Nanopore sensors for nucleic acid analysis", Nature Nanotechnology, Oct. 2011, vol. 6, pp. 615-624.

Wang, Y., et al., "Scalable nanopore chip with self-aligned transverse tunneling junction for DNA detection and sequencing", ACS Sensors, Submitted by Author on Oct. 2, 2020, 17 pages.

Wanunu, M., "Nanopores: A journey towards DNA sequencing", Physics of Life Reviews, 2012, vol. 9, pp. 125-158.

Wanunu, M., et al., "Electrostatic focusing of unlabelled DNA into nanoscale pores using a salt gradient", Nature Nanotechnology, Feb. 2010, vol. 5, pp. 106-165.

Wendell, D., et al., "Translocation of double-stranded DNA through membrane-adapted phi29 motor protein nanopores", Nature Nanotechnology, Nov. 2009, vol. 4, pp. 765-772.

Zhou, J., et al., "Enhanced nanochannel translocation and localization of genomic DNA molecules using three-dimensional nanofunnels", Nature Communications, 2017, vol. 8, No. 807, pp. 1-8.

Written Opinion of the International Searching Authority of PCT/US21/40562, Apr. 5, 2022, 10 pages.

International Search Report of PCT/US21/40562, Apr. 5, 2022, 4 pages.

Written Opinion of the International Searching Authority for PCT/US21/40568, Feb. 14, 2022, 6 pages.

International Search Report for PCT/US21/40568, Feb. 14, 2023, 4 pages.

Wang, Y., et al., "Nanopore chip with self-aligned transverse tunneling junction for DNA detection", Biosensors and Bioelectronics, Aug. 9, 2021, pp. 1-7, vol. 193, No. 113552, Elsevier B.V.

* cited by examiner

METHOD FOR CONSTRUCTING MAGNETIC TUNNELING JUNCTION DEVICES AND USE OF DEVICE FOR SPIN-DEPENDENT TRANSPORT CHARACTERIZATION

CROSS-REFERENCE TO RELATED APPLICATIONS

This application is a U.S. National Phase Patent Application of International Application Number PCT/US2021/040568, filed on Jul. 6, 2021, which claims priority to U.S. Provisional Application No. 63/049,477, filed on Jul. 8, 2020, the entire content of each of which is incorporated herein by reference.

GOVERNMENT SUPPORT CLAUSE

This invention was made with government support under FA9550-16-1-0052 awarded by the Air Force Office of Scientific Research. The government has certain rights in the invention.

FIELD

This disclosure relates to magnetic tunneling junction (MTJ) devices and in particular, to methods of making MTJ devices and uses thereof, such as for electron spin-dependent transport characterization.

BACKGROUND

A typical magnetic tunneling junction (MTJ) has two layers of magnetic metal separated by an ultrathin layer of insulator such that electrons can tunnel through the barrier between the metals. The conductance of the MTJ depends on the relative orientation of the magnetizations of the two magnetic layers, which can be controlled by an applied magnetic field.

The electron spin can interact with chiral molecules as it passes through the potential field in the molecule, which can appear as a magnetic field in the electron's reference frame and exert Lorentz force to change the magnetic momentum asymmetrically depending on the polarization of the spin. If one puts the molecule between two magnetized electrodes and measures the tunneling current across this junction, the conductance of the molecule would depend on the spin polarization of the injected electron, the chirality of the molecule, and the magnetization polarity of the detector. This phenomenon can be used to detect the structure of specific molecules and monitor the dynamics of molecule interactions.

There are several ways to construct magnetic tunneling junctions (MTJs), including using a scanning tunneling microscope (STM) or atomic force microscope (AFM) with a magnetized tip or sensor and a magnetic substrate, or depositing ultrathin dielectric layers on top of the surface of a magnetic film before depositing another layer of magnetic film to fabricate a sandwiched structure. For STM and AFM based techniques, the tunneling distance is uncertain due to the servo control of the tips. For rigid structures with dielectric sandwiched in multiple metal films, it is hard to expose the MTJ to biomolecules for binding. Therefore, these conventional methods do not allow for an effective way of integrating biomolecules under physiological conditions. This is the reason why most of the spin-dependent measurement on biomolecules so far has been focused on optical excitation of electrons on a bare metal surface functionalized with the molecule and detection of the emitted electrons on a far end using some macroscopic collectors.

SUMMARY

Disclosed herein is a MTJ device structure and the method of constructing such devices which overcomes aforementioned limitations of conventional MTJ devices. Also disclosed are methods of using the device for spin-dependent transport characterization through biomolecules for structure and dynamic function analysis in physiological environments. The disclosed fabrication method uses asymmetric electrochemical deposition inside a confined nanoscale cavity to produce magnetic metal electrodes that are 5-200 nm thick in a planar configuration. The asymmetric widths of the electrodes lead to different coercivity in an external magnetic field, allowing one the opportunity to accurately evaluate how the spin injected from one electrode can interact with the chiral molecules inserted into this tunneling gap resulting in different junction conductance.

In embodiments, an electronic device, comprises a cis-fluidic channel/chamber and a trans-fluidic channel/chamber fabricated on a planar substrate; a channel in between and connecting the cis-fluidic and trans-fluidic channels/chambers; a first non-magnetic electrode and a second non-magnetic electrode sealed inside the channel, wherein the first and second non-magnetic electrodes being electrochemically deposited with one or more magnetic metal materials within the channel and under feed-back control, thereby forming a magnetic tunneling junction such that the distance between the first and second non-magnetic electrodes is between about 1-100 nm and coercivity of each of the electrodes can be individually tuned.

In embodiments, the planar substrate is a transparent substrate, such as glass or quartz.

In embodiments, the planar substrate is a non-transparent substrate, such as silicon coated with a layer of oxide.

In embodiments, the first non-magnetic electrode and second non-magnetic electrode are formed of gold, palladium, platinum or combinations thereof.

In embodiments, the cavity in which the first non-magnetic electrode and second non-magnetic electrode are sealed is formed by one or more dielectric layers.

In embodiments, the one or more dielectric layers is $HfO_2$, $SiO_2$ or any combination thereof.

In embodiments, the one or more magnetic metals are Ni, Co, Ni alloy, Co alloy or combinations thereof.

In embodiments, a method to characterize the chirality and dynamics of conformations of a molecule, comprises measuring the spin-dependent conductance across a magnetic tunneling junction (MTJ) with a MTJ device and by applying an external magnetic field.

In embodiments, a method of making the magnetic tunneling junction (MTJ) device, comprises depositing one or more sacrificial layers on a planar substrate to define a guiding channel leading to a tunneling junction and height of a confined space for allowing electrochemical deposition; positioning a pair of non-magnetic metal electrodes with spacing around 500 nm and 1 µm on top of a center region of the one or more sacrificial layers; depositing a dielectric passivation layer on the pair of non-magnetic metal electrodes to seal the pair of non-magnetic metal electrodes within the one or more sacrificial layers; depositing a top polymer of dielectric layer patterned to construct the shape of channels on top of the dielectric passivation layer to both protect the pair of non-magnetic metal electrodes underneath and serve as a mask; exposing the one or more sacrificial layers below an open window area in the polymer or di-electric top mask by a reactive ion etching process; attaching a top cover to seal the channels; chemically etching one or more passivation layers by filling the channels with etchants for construct of the chambers/channels that lead to the pair of non-magnetic electrodes; depositing an additional magnetic metal layer onto one of the non-magnetic electrodes by electrochemical deposition; and depositing an additional magnetic metal layer onto second non-magnetic electrodes by electrochemical deposition to form an asymmetric magnetic tunneling junction.

In embodiments, the planar substrate is a transparent substrate, such as glass or quartz.

In embodiments, the planar substrate is a non-transparent substrate, such as silicon coated with a layer of oxide.

In embodiments, the pair of non-magnetic electrodes are formed of gold, palladium, platinum or combinations thereof.

In embodiments, the cavity in which the first non-magnetic electrode and second non-magnetic electrode are sealed is formed by one or more dielectric layers.

In embodiments, the dielectric passivation layer on the pair of non-magnetic metal electrodes to seal the pair of non-magnetic metal electrodes within the one or more sacrificial layers is HfO2, SiO2 or any combination thereof.

In embodiments, the additional magnetic metal in the additional magnetic metal is Ni, Co, Ni alloy, Co alloy or combinations thereof.

In embodiments, the top polymer layer patterned to construct the shape of channels on top of the dielectric passivation layer to both protect the pair of non-magnetic metal electrodes underneath and serve as a mask is SU-8.

In embodiments, the top dielectric layer patterned to construct the shape of channels on top of the dielectric passivation layer to both protect the pair of non-magnetic metal electrodes underneath and serve as a mask is SiO2.

In embodiments, the method produces magnetic metal electrodes that are 5-200 nm thick in a planar configuration.

The foregoing and other features of the disclosure will become more apparent from the following detailed description, which proceeds with reference to the accompanying figures.

BRIEF DESCRIPTION OF DRAWINGS

Embodiments will be readily understood by the following detailed description in conjunction with the accompanying drawings and the appended claims. Embodiments are illustrated by way of example and not by way of limitation in the figures of the accompanying drawings.

DETAILED DESCRIPTION OF DISCLOSED EMBODIMENTS

In the following detailed description, reference is made to the accompanying drawings that form a part hereof, and in which are shown by way of illustration embodiments that may be practiced. It is to be understood that other embodiments may be utilized and structural or logical changes may be made without departing from the scope. Therefore, the following detailed description is not to be taken in a limiting sense, and the scope of embodiments is defined by the appended claims and their equivalents.

Various operations may be described as multiple discrete operations in turn, in a manner that may be helpful in understanding embodiments; however, the order of description should not be construed to imply that these operations are order dependent.

For the purposes of the description, a phrase in the form "A/B" or in the form "A and/or B" means (A), (B), or (A and B). For the purposes of the description, a phrase in the form "at least one of A, B, and C" means (A), (B), (C), (A and B), (A and C), (B and C), or (A, B and C). For the purposes of the description, a phrase in the form "(A)B" means (B) or (AB) that is, A is an optional element.

The description may use the terms "embodiment" or "embodiments," which may each refer to one or more of the same or different embodiments. Furthermore, the terms "comprising," "including," "having," and the like, as used with respect to embodiments, are synonymous, and are generally intended as "open" terms (e.g., the term "including" should be interpreted as "including but not limited to," the term "having" should be interpreted as "having at least," the term "includes" should be interpreted as "includes but is not limited to," etc.).

With respect to the use of any plural and/or singular terms herein, those having skill in the art can translate from the plural to the singular and/or from the singular to the plural as is appropriate to the context and/or application. The various singular/plural permutations may be expressly set forth herein for sake of clarity.

The term "a" or "an" may mean more than one of an item.

The term "about" means within plus or minus 10% of a stated value. For example, "about 100" would refer to any number between 90 and 110.

Unless otherwise noted, technical terms are used according to conventional usage. Definitions of common terms in molecular biology can be found in Benjamin Lewin, Genes IX, published by Jones and Bartlet, 2008 (ISBN 0763752223); Kendrew et al. (eds.), The Encyclopedia of Molecular Biology, published by Blackwell Science Ltd., 1994 (ISBN 0632021829); and Robert A. Meyers (ed.), Molecular Biology and Biotechnology: a Comprehensive Desk Reference, published by VCH Publishers, Inc., 1995 (ISBN 9780471185710); and other similar references.

Suitable methods and materials for the practice or testing of this disclosure are described below. Such methods and materials are illustrative only and are not intended to be limiting. Other methods and materials similar or equivalent to those described herein can be used. For example, conventional methods well known in the art to which this disclosure pertains are described in various general and more specific references, including, for example, Sambrook et al., *Molecular Cloning: A Laboratory Manual*, 2d ed., Cold Spring Harbor Laboratory Press, 1989; Sambrook et al., *Molecular Cloning: A Laboratory Manual*, 3d ed., Cold Spring Harbor Press, 2001; Ausubel et al., *Current Protocols in Molecular Biology*, Greene Publishing Associates, 1992 (and Supplements to 2000); Ausubel et al., i Short Protocols in Molecular Biology: A Compendium of Methods from Current Protocols in Molecular Biology, 4th ed., Wiley & Sons, 1999; Harlow and Lane, *Antibodies: A Laboratory Manual*, Cold Spring Harbor Laboratory Press, 1990; and Harlow and Lane, *Using Antibodies: A Laboratory Manual*, Cold Spring Harbor Laboratory Press, 1999. In addition, the materials, methods, and examples are illustrative only and not intended to be limiting.

I. Terms

To facilitate review of the various embodiments of the disclosure, the following explanations of specific terms are provided:

Binding or stable binding: An association between two substances or molecules, such as the association of an antibody with a peptide. Binding can be detected by any procedure known to one skilled in the art, such as by physical or functional properties of the formed complexes.

Biomolecule: A molecule that is produced by a living organism. For example, a biomolecule is an organic molecule and especially a macromolecule (such as a protein or nucleic acid) in living organisms.

Chemical Modification: A number of various processes involving the alteration of the chemical constitution or structure of molecules. In one example, a chemically-modified electrode is an electrode that has a surface chemically converted to change the electrode's properties, such as its' physical, chemical, electrochemical, optical, electrical, and/or transport characteristics.

Cis-chamber and Trans-chamber: A "cis-chamber" is first chamber and a "trans-chamber" is a second chamber that is opposite to the cis-chamber. In embodiments, the cis chamber is a negative electrode chamber and the trans-chamber is the positive electrode chamber on the opposite side of a nanogap from the cis chamber such that a molecule in the cis-chamber can be guided through the MTJ to the trans-chamber by a driving bias.

Contacting: Placement in direct physical association, including both a solid and liquid form.

Current stream: The term "current stream" refers to the current signal Generated over time from a device described herein.

Deposit: An accumulation or layer of solid material, either consolidated or unconsolidated, left or laid down.

Dielectric: A dielectric material is a type of insulator which becomes polarized when it comes in contact with an electrical field. When dielectrics are placed in an electric field, practically no current flows in them because, unlike metals, they have no loosely bound, or free, electrons that may drift through the material. Instead, electric polarization occurs.

Electrochemical Deposition: A process by which a thin and tightly adherent desired coating of metal, oxide, or salt can be deposited onto the surface of a conductor substrate by simple electrolysis of a solution containing the desired metal ion or its chemical complex. Electrochemical deposition transports metal ions in a solution by an electric field to coat the surface of a substrate. Electrochemical deposition is an efficient procedure to prepare metal nanoparticles.

Isolated: An "isolated" biological component (such as a nucleic acid molecule, protein, or cell) has been substantially separated or purified away from other biological components in the cell of the organism, or the organism itself, in which the component naturally occurs, such as other chromosomal and extra-chromosomal DNA and RNA, proteins and cells. Nucleic acid molecules and proteins that have been "isolated" may be understood to have been purified by standard purification methods. The term also embraces nucleic acid molecules and proteins prepared by recombinant expression in a host cell as well as chemically synthesized nucleic acid molecules and proteins.

Label: An agent capable of detection, for example, a label can be attached to a nucleic acid molecule or protein (indirectly or directly), thereby permitting detection of the nucleic acid molecule or protein. Examples of labels include, but are not limited to, radioactive isotopes, enzyme substrates, co-factors, ligands, chemiluminescent agents, fluorophores, haptens, enzymes, and combinations thereof. Methods for labeling and guidance in the choice of labels appropriate for various purposes are discussed for example in Sambrook et al. (Molecular Cloning: A Laboratory Manual, Cold Spring Harbor, New York, 1989) and Ausubel et al. (In Current Protocols in Molecular Biology, John Wiley & Sons, New York, 1998).

Linked or linker: The term "linked" means joined together, either directly or indirectly. For example, a first moiety may be covalently or noncovalently (e.g., electrostatically) linked to a second moiety. This includes, but is not limited to, covalently bonding one molecule to another molecule, noncovalently bonding one molecule to another (e.g., electrostatically bonding), non-covalently bonding one molecule to another molecule by hydrogen bonding, non-covalently bonding one molecule to another molecule by van der Waals forces, and any and all combinations of such couplings. Indirect attachment is possible, such as by using a "linker" (a molecule or group of atoms positioned between two moieties).

In several embodiments, linked components are associated in a chemical or physical manner so that the components are not freely dispersible from one another. For example, two components may be covalently bound to one another so that the two components are incapable of separately dispersing or diffusing.

Nucleic acid: A deoxyribonucleotide or ribonucleotide polymer, which can include analogues of natural nucleotides that hybridize to nucleic acid molecules in a manner similar to naturally occurring nucleotides. In a particular example, a nucleic acid molecule is a single stranded (ss) DNA or RNA molecule, such as a probe or primer. In another particular example, a nucleic acid molecule is a double stranded (ds) nucleic acid, such as a target nucleic acid. The term "nucleotide" refers to a base-sugar-phosphate combination and includes ribonucleoside triphosphates ATP, UTP, CTG, GTP and deoxyribonucleoside triphosphates such as dATP, dCTP, dITP, dUTP, dGTP, dTTP, or derivatives thereof.

Optional: "Optional" or "optionally" means that the subsequently described event or circumstance can but need not occur, and that the description includes instances where said event or circumstance occurs and instances where it does not.

Protein: The terms "protein," "peptide," "polypeptide" refer, interchangeably, to a polymer of amino acids and/or amino acid analogs that are joined by peptide bonds or peptide bond mimetics. The twenty naturally-occurring amino acids and their single-letter and three-letter designations are as follows: Alanine A Ala; Cysteine C Cys; Aspartic Acid D Asp; Glutamic acid E Glu; Phenylalanine F Phe; Glycine G Gly; Histidine H His; Isoleucine I He; Lysine K Lys; Leucine L Leu; Methionine M Met; Asparagine N Asn; Proline P Pro; Glutamine Q Gln; Arginine R Arg; Serine S Ser; Threonine T Thr; Valine V Val; Tryptophan w Trp; and Tyrosine Y Tyr. In one embodiment, a peptide is an antibody or fragment or part thereof, for example, any of the fragments or antibody chains listed above. In some embodiments, the peptide may be post-translationally modified.

Sample: A mixture of molecules that comprises at least an analyte molecule that is subjected to manipulation in accordance with the systems and/or methods of the disclosure.

Translocation: A change in location. As used herein, a DNA translocation event, refers to DNA moving through a nanogap.

Transparent substrate: A material made up of components with a uniform index of refraction. Transparent materials appear clear, with the overall appearance of one color, or any combination leading up to a brilliant spectrum of every color; light is allowed to pass through the substrate without appreciable scattering of light. The opposite property of translucency is opacity or non-transparent. Examples of transparent substrates include, but are not limited to, glass or quartz.

Under conditions sufficient to: A phrase that is used to describe any environment that permits the desired activity.

II. General Description

Disclosed herein is a MTJ device structure and the method of constructing such devices which overcomes aforementioned limitations of conventional MTJ devices. Also disclosed are methods of using the device, such as for spin-dependent transport characterization through biomolecules for structure and dynamic function analysis in physiological environments. In embodiments, the disclosed fabrication method uses asymmetric electrochemical deposition inside a confined nanoscale cavity to produce magnetic metal electrodes that are about 5 nm and about 200 nm thick in a planar configuration. The asymmetric widths of the electrodes lead to different coercivity in an external magnetic field, allowing one the opportunity to accurately evaluate how the spin injected from one electrode can interact with the chiral molecules inserted into this tunneling gap resulting in different junction conductance.

Figure 1:
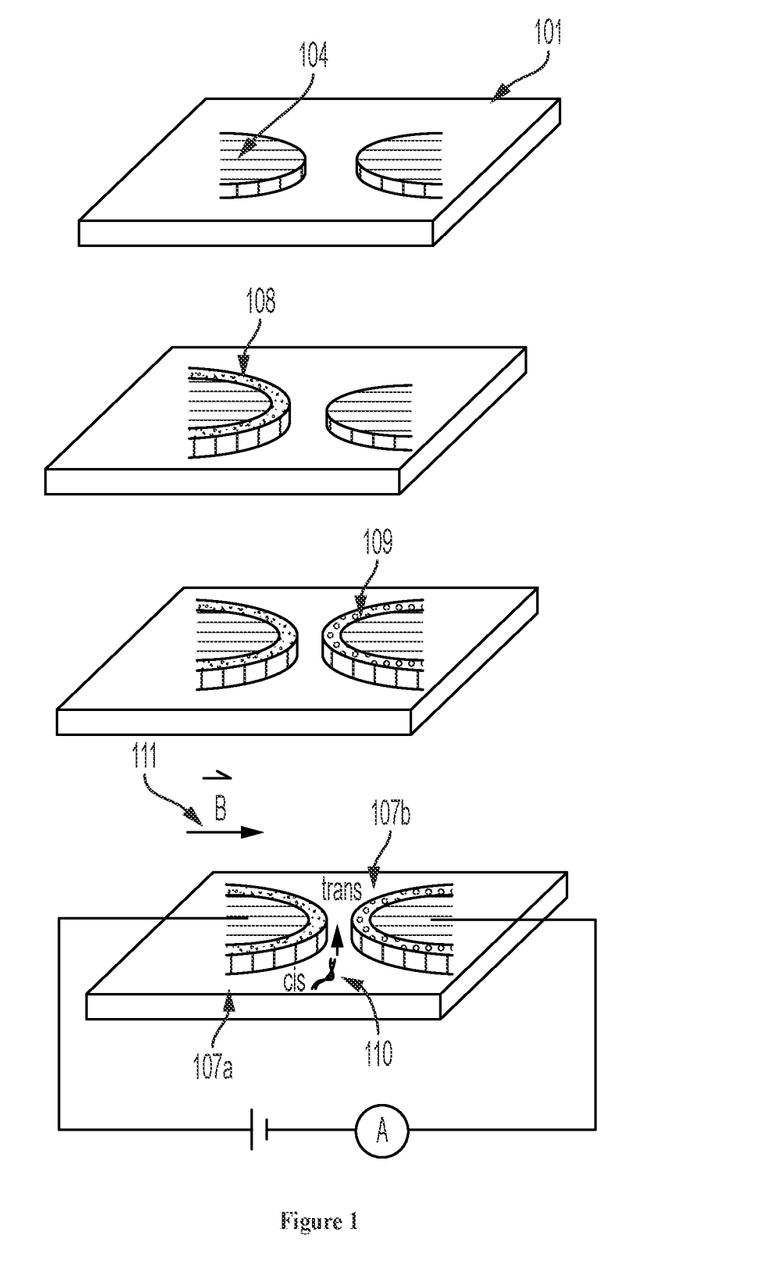
FIG. 1 shows schematics of preparing an MTJ with asymmetric magnetic electrodes in accordance with embodiments presented herein. For clarity, the top layers that confines the electrochemical deposition is not drawn.

Referring to FIG. 1, in embodiments, the preparation of a MTJ begins with a pair of metal electrodes 104 made of Au, Pd or Pt or other non-magnetic metals such as Ir, Ag, W, Cu, or their alloys or combination thereof sealed within a cavity formed by one or more dielectric layers such as $HfO_2$, $SiO_2$ or other dielectric materials such as $Si_3N_4$, or $ZrO_2$, or $Al_2O_3$, all fabricated on a planar substrate 101 made of silicon, quartz or other materials such as sapphire or mica. In embodiments, magnetic layer 108 and 109 are asymmetrically deposited on each of the electrodes with their thickness confined in the cavity. It is contemplated that the magnetic layer has a z-thickness (in the direction perpendicular to the substrate surface) that is defined by the height of the cavity, such as between about 5 and about 200 nm, including 5 to 100 nm, 10 to 100 nm, 5 to 50 nm, or 10 to 200 nm, and an extending thickness (in the direction parallel to the substrate surface extending from the electrode tip surface) such as between about 10 nm and about 2000 nm, including 10 to 100 nm, 10 to 1000 nm, 100 to 1000 nm, 100 to 500 nm, or 100 to 2000 nm. The coercivity of the magnetic layer 108 and 109 depends on their extending thickness and can be finely tuned to be different so that their polarization of magnetization can be individually controlled and measured. In some embodiments, two chambers cis- 107a and trans- 107b are constructed on the two lateral sides of the electrode pairs such that a molecule 110 in 107a can be guided through the MTJ to 107b by a driving bias. For example, the molecule can bind to the surface of the metals to form a bridge between the MTJ, and the conductance can be measured inside an external magnetic field B 111. The present design allows the asymmetric feed-back controlled electrochemical deposition of magnetic materials inside a confined nanoscale cavity (such as a height of 5 nm to 200 nm) to form a MTJ, and use it for single-molecule spin-dependent conductance detections.

Figure 2:
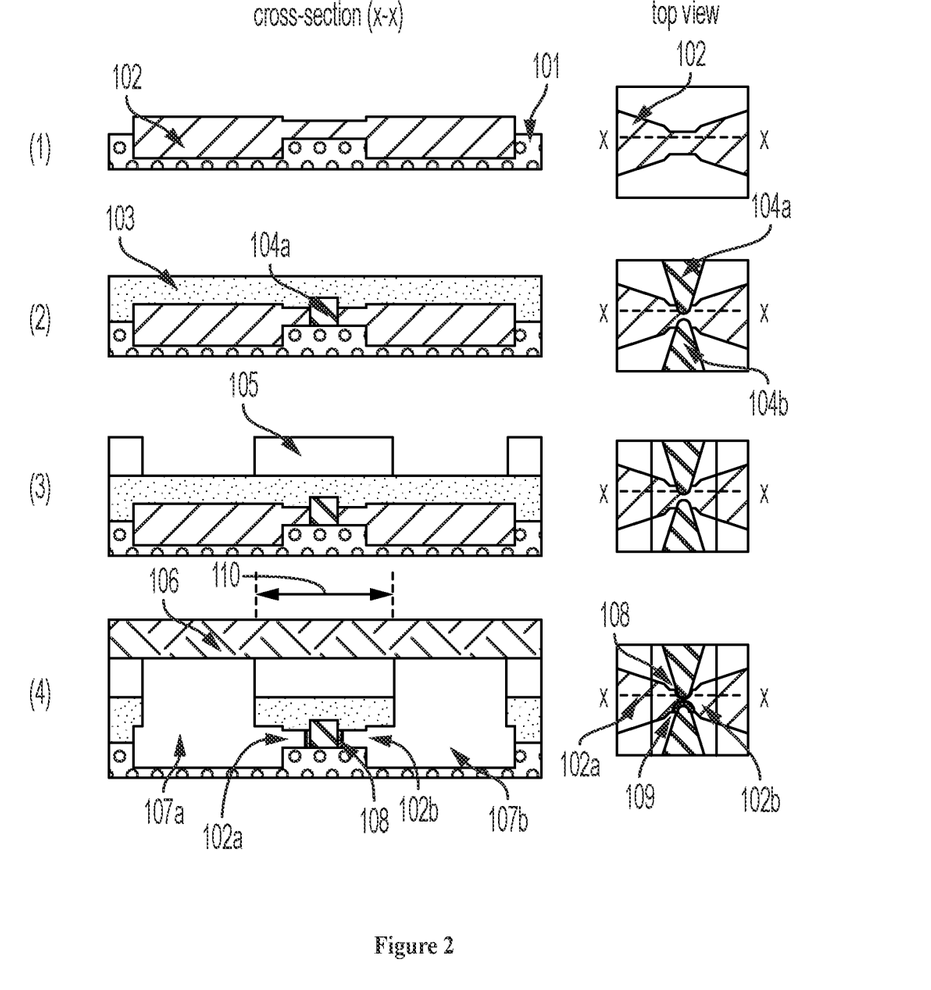
FIG. 2 provides 4 stages of a fabrication process of an MTJ device in accordance with embodiments disclosed herein.

As shown in FIG. 2, one or more sacrificial layers 102 is first deposited on a transparent substrate 101 such as glass or quartz. In embodiments, sacrificial layers are composed of two sections: Section I being defined close to the position of the tip of the electrodes 104, shown as the center thinner part in FIG. 2, which has a thickness of about 5 to about 200 nm. In embodiments, Section II is defined at the outer sides of Section I, shown as the thicker parts in FIG. 2. In embodiments, Section II constitutes the space that joins the fluidic chambers/channels at the outside with the inner space, as defined by Section I, at the tip of the electrodes, where the core deposition of metal is performed. In embodiments, the thickness of Section II is between about 200 nm and 1000 nm. If no optical access is required, other non-magnetic substrates with insulating surface can be used such as silicon coated with a layer of silicon oxide or silicon nitride. The sacrificial layer defines the guiding channel leading to the tunneling junction (102a and 102b), and the height of the confined space where later electrochemical deposition will happen (center portion in the drawing).

In embodiments, in a second step, a pair of electrodes 104a and 104b made of gold, palladium, or platinum or other non-magnetic metals such as Ir, Ag, W, Cu, or their alloys or combination thereof with spacing larger than the final MTJ size, typically between 500 nm and 1 μm, are fabricated on top of the center region of the sacrificial layer. Then a top dielectric passivation layer 103 of $HfO_2$, or $SiO_2$ or $ZrO_2$ or other dielectric materials with typical thickness of 10-1000 nm is deposited to seal the metal surface.

In embodiments, in a third step, a top layer made of either polymer such as SU-8 or dielectric such as $SiO_2$ is patterned to construct the shape of the channels 105 on top of the dielectric passivation layer to both protect the electrodes underneath and serve as a mask for the etching process in the next step. It is contemplated that the shape of channels can vary for best efficiency of diffusion of molecules to the gap, as well as optimal translocation control. The core dimension of the pattern of the channels is the lateral width of the barrier between channels (marked as 110 in FIG. 2), below which the nanogap and sacrificial layers are sealed. In other words, the closest distance between the cis- and trans- channels/chambers, defined by the SU-8 polymer or dielectric in this step, is between about 1 and 100 micrometers, for higher yield and less diffusion resistance.

In embodiments, in a fourth step, a reactive ion etching process is used to expose the sacrificial layer below the open window area in the polymer mask, and a top cover 106 is attached to seal the channels. The remaining passivation layers are then chemically etched by filling the channels with proper etchants for construct the chamber and channels 107a and 107b that leads to the metal electrodes. In embodiments, the sacrificial layers 102 are chromium, aluminum and magnesium. Correspondingly, in embodiments, the etchant for these materials are chromium etchant, aluminum etchant and magnesium etchant or a combination thereof.

In embodiments, in a fifth step, an electrochemical deposition is used to deposit an additional magnetic metal layer 108 of Ni, Co, or other magnetic metals or alloys onto one of the existing metal electrodes which are now exposed in the confined space. The z-thickness (perpendicular to the surface of the substrate) of 108 is confined by the space near the exposed electrode tip. Specifically, this is defined by the sacrificial layer 102, such as between about 5 nm and 200 nm. The extending thickness of 108 (parallel to the surface of the substrate, extending from the original tip surface of the metal electrodes), is defined by the time and current of the electrochemical deposition, between about 1 nm and 500 nm. Then another electrochemical deposition process similar to the previous step is used to deposit an additional magnetic metal layer 109 of Ni, Co or other magnetic metals or alloys onto the other of the existing metal electrodes to form an asymmetric magnetic tunneling junction. The z-thickness (perpendicular to the surface of the substrate) of 109 is confined by the space near the exposed electrode tip. Specifically, this is defined by the sacrificial layer 102, between about 5 nm to about 200 nm. The extending thickness of 109 (parallel to the surface of the substrate, extending from the original tip surface of the metal electrodes), is defined by the time and current of the electrochemical deposition, between about 1 nm to about 500 nm. The extending thickness of 108 and 109 should be different so that the coercive fields of them are different.

In embodiments, a feedback circuit is used to control the deposition process such that the distance between the metal electrodes will be finely tuned to fit the size required for mounting molecules for characterization, typically between 1-100 nm, such as between 10-50 nm, between 1-20 nm, between 20-60 nm, including, but not limited to between 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, 99 or 100 nm.

In embodiments, as a molecule analyte is delivered to the cis-chamber on one side of the nanogap, the molecule is guided through the MTJ by a bias, such as a bias between 10 mV and about 1000 mV, applied between the cis- and trans-chamber. The molecule can then bind to the surface of the metals by chemical bonding or other electrostatic interactions to form a bridge between the electrodes. It is contemplated that the bias potential can be tunable for flexible control of the translocation as desired.

Figure 3A:
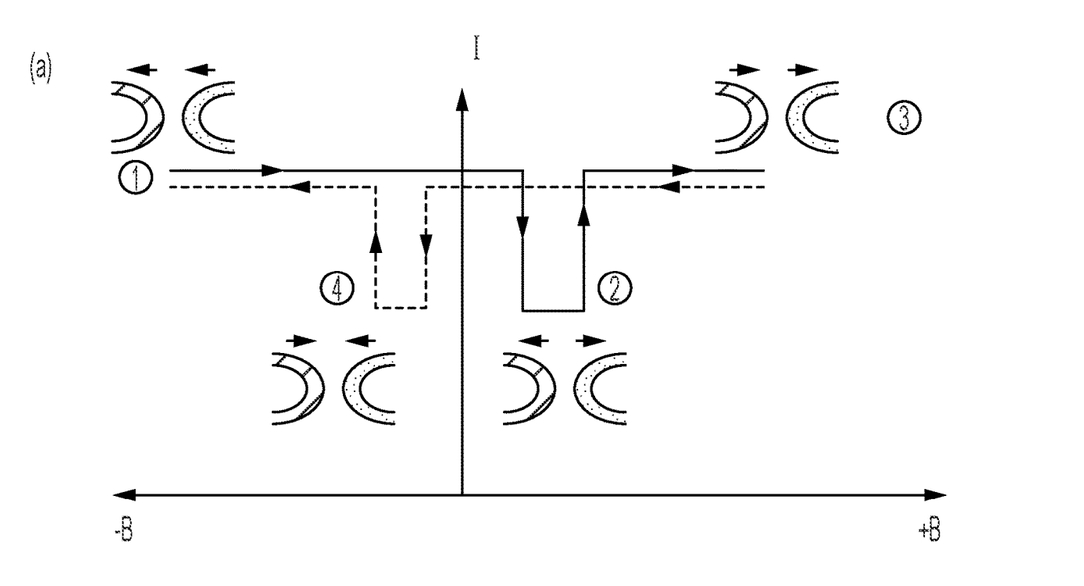
FIGS. 3A and 3B provide an exemplified protocol for measuring the polarization of magnetization of the asymmetric electrodes, and effect of a chiral molecule between the MTJ on the conductance of a parallelly polarized MTJ.

In embodiments, and as shown in FIG. 3(*a*), the polarity of the magnetization of the asymmetric electrodes can be evaluated and controlled. For example, the device can be placed in a uniform magnetic field in plane with the electrodes. The field starts as strong (as depicted in the drawing) with direction to the left (−B direction), in which case both electrodes will yield their magnetization polarity to the −B direction. The electron emitted from one electrode has no difficulty tunneling to the other electrode, resulting in a high conductance/current state when a bias, such as a bias between 1-1000 mV, is applied between the electrodes (state 1).

In embodiments, the B field can be swept to become weaker towards zero, and during this process, the magnetization of both electrodes will stay unchanged and conductance state not changed. When zero field is reached, the B field will be increased towards the right (e.g., +B direction). In embodiments, one of the electrodes has smaller coercivity and reorient its polarization to align with +B direction, while the other remains unchanged. In this antiparallel configuration, the current/conductance between the electrode decreases (state 2). Continuing to increase the B field in the +B direction will later force both electrodes to align with polarity to the +B direction, and the current/conductance will then return to high state (state 3). If we scan the B field in the opposite way back to −B direction, an opposite process will happen to have the system switch from high conductance state 3 to low conductance 4 (but when the magnetic field is in the −B direction region), and then later to state 1 again when magnetic field is strong in −B direction.

Figure 3B:
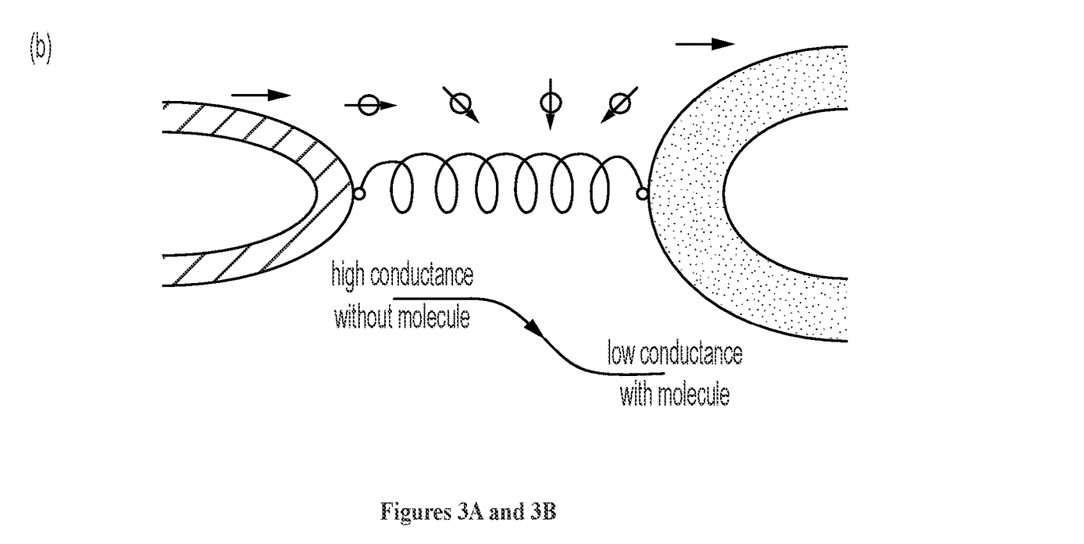

In embodiments, when a molecule is trapped between the MTJ, the interaction between spin-polarized electrodes as injected from one electrode will interact with the asymmetric potential field of the molecule, which will turn the magnetic momentum of the spin, and therefore change the apparent conductance between the junction. For example, as shown in FIG. 3*b*, when the polarization of the two electrodes are parallel, without the molecule a high conductance state is present, but with the molecule, the conductance becomes lower because the spin polarity of the electron will misalign with the original direction. This can be used to detect the chirality of the molecule structure, as well as for probing dynamic motions of the molecule that will change the orientation/chirality of the molecule. As such, methods of detecting the chirality of a molecule structure are provided.

Although certain embodiments have been illustrated and described herein, it will be appreciated by those of ordinary skill in the art that a wide variety of alternate and/or equivalent embodiments or implementations calculated to achieve the same purposes may be substituted for the embodiments shown and described without departing from the scope. Those with skill in the art will readily appreciate that embodiments may be implemented in a very wide variety of ways. This application is intended to cover any adaptations or variations of the embodiments discussed herein. Therefore, it is manifestly intended that embodiments be limited only by the claims and the equivalents thereof.

I claim:
1. An electronic device, comprising:
a cis-fluidic channel/chamber and a trans-fluidic channel/chamber fabricated on a planar substrate;
a channel in between and connecting the cis-fluidic and trans-fluidic channels/chambers; and
a first non-magnetic electrode and a second non-magnetic electrode sealed inside the channel, wherein the first and second non-magnetic electrodes being electrochemically deposited with one or more magnetic metal materials within the channel and under feed-back control, thereby forming a magnetic tunneling junction such that the distance between the first and second non-magnetic electrodes is between about 1-100 nm and coercivity of each of the electrodes can be individually tuned.

2. The device of claim 1, wherein the planar substrate is a transparent substrate.

3. The device of claim 2, wherein the transparent substrate is glass or quartz.

4. The device of claim 1, wherein the planar substrate is a non-transparent substrate.

5. The device of claim 4, wherein the non-transparent substrate is silicon coated with a layer of oxide.

6. The device of claim 1, wherein the first non-magnetic electrode and second non-magnetic electrode are formed of gold, palladium, platinum or combinations thereof.

7. The device of claim 1, wherein a cavity in which the first non-magnetic electrode and second non-magnetic electrode are sealed is formed by one or more dielectric layers.

8. The device of claim 7, wherein the one or more dielectric layers is HfO2, SiO2 or any combination thereof.

9. The device of claim 1, wherein the one or more magnetic metal materials are Ni, Co, Ni alloy, Co alloy or combinations thereof.

10. A method to characterize the chirality and dynamics of conformations of a molecule, comprising: measuring the spin-dependent conductance across a magnetic tunneling junction (MTJ) with a MTJ device of claim 1 and by applying an external magnetic field.

11. A method of making a magnetic tunneling junction (MTJ) device, comprising:
- depositing one or more sacrificial layers on a planar substrate to define a guiding channel leading to a tunneling junction and height of a confined space for allowing electrochemical deposition;
- positioning a pair of non-magnetic metal electrodes with spacing between 500 nm and 1 μm on top of a center region of the one or more sacrificial layers;
- depositing a dielectric passivation layer on the pair of non-magnetic metal electrodes to seal the pair of non-magnetic metal electrodes within the one or more sacrificial layers;
- depositing a top polymer or dielectric layer patterned to construct the shape of channels on top of the dielectric passivation layer to both protect the pair of non-magnetic metal electrodes underneath and serve as a mask;
- exposing the one or more sacrificial layers below an open window area in the polymer or dielectric top mask by a reactive ion etching process;
- attaching a top cover to seal the channels;
- chemically etching one or more passivation layers by filling the channels with etchants for construct of the channels that lead to the pair of non-magnetic metal electrodes;
- depositing a first additional magnetic metal layer onto one of the non-magnetic metal electrodes by electrochemical deposition; and
- depositing a second additional magnetic metal layer onto the other of the non-magnetic electrodes by electrochemical deposition to form an asymmetric magnetic tunneling junction.

12. The method of making of claim 11, wherein the planar substrate is a transparent substrate.

13. The method of making of claim 12, wherein the transparent substrate is glass or quartz.

14. The method of making of claim 11, wherein the planar substrate is a non-transparent substrate.

15. The method of making of claim 14, wherein the non-transparent substrate is silicon coated with a layer of oxide.

16. The method of making of claim 11, wherein the pair of non-magnetic metal electrodes are formed of gold, palladium, platinum or combinations thereof.

17. The method of making of claim 11, wherein the dielectric passivation layer on the pair of non-magnetic metal electrodes to seal the pair of non-magnetic metal electrodes within the one or more sacrificial layers is HfO2, SiO2 or any combination thereof.

18. The method of making of claim 11 wherein the magnetic metal in the first additional magnetic metal layer or in the second additional magnetic metal layer is Ni, Co, Ni alloy, Co alloy or combinations thereof.

19. The method of making of claim 11, wherein the top polymer of dielectric layer patterned to construct the shape of channels on top of the dielectric passivation layer to both protect the pair of non-magnetic metal electrodes underneath and serve as a mask is SU-8.

20. The method of making of claim 11, wherein the top polymer of dielectric layer patterned to construct the shape of channels on top of the dielectric passivation layer to both protect the pair of non-magnetic metal electrodes underneath and serve as a mask is SiO2.

21. The method of making of claim 11, wherein the method produces magnetic metal electrodes that are 5-200 nm thick in a planar configuration.

* * * * *